United States Patent [19]

Saint et al.

[11] 4,433,313

[45] Feb. 21, 1984

[54] APPARATUS FOR MICROWAVE DIRECTIONAL COUPLING BETWEEN A WAVEGUIDE AND A STRIPLINE

[75] Inventors: Jacques Saint, Houilles; Gérard Collignon, Savigny sur Orge, both of France

[73] Assignee: Societe d'Etude du Radant, France

[21] Appl. No.: 300,603

[22] Filed: Sep. 9, 1981

[30] Foreign Application Priority Data

Sep. 12, 1980 [FR] France ............... 80 19693

[51] Int. Cl.³ .................... H01P 5/18; H01P 5/107
[52] U.S. Cl. .................................... 333/109; 333/26; 343/368
[58] Field of Search ............. 333/109, 115, 116, 26; 343/854

[56] References Cited

U.S. PATENT DOCUMENTS

| | | | |
|---|---|---|---|
| 3,114,888 | 12/1963 | Wilson | 333/109 |
| 3,587,004 | 6/1971 | Parad | |
| 3,593,208 | 7/1971 | Smith | 333/116 X |
| 4,080,579 | 3/1978 | Fassett | |

FOREIGN PATENT DOCUMENTS 1574876 7/1969 France .

*Primary Examiner*—Paul L. Gensler
*Attorney, Agent, or Firm*—Finnegan, Henderson, Farabow, Garrett & Dunner

[57] ABSTRACT

A method and apparatus for directionally coupling two technically different microwave transmission lines, one being a waveguide and the other a stripline, in which a central conductor of the stripline is plunged into waveguide through a slot in a wall of the waveguide and loaded by capacitors or inductors. The width of the central conductor and values of the capacitors and inductors determines the desired coupling coefficient.

15 Claims, 7 Drawing Figures

APPARATUS FOR MICROWAVE DIRECTIONAL COUPLING BETWEEN A WAVEGUIDE AND A STRIPLINE

BACKGROUND OF THE INVENTION

I. Field Of The Invention

The present invention relates to apparatus and method for directionally coupling a stripline or microstrip to a waveguide-type transmission line. The invention has application to the "slab" type of plane microwave antennas and to the control of microwave power.

II. Description Of The Prior Art

Even though the power tolerance of striplines has much increased due to the feasibility of bonding the various components, it still remains relatively modest. Therefore, with regard to high power antennas, it is sometimes necessary to use a main power distributor having waveguide design capable of tolerating high power and capable of feeding the remainder of the antenna having a stripline design. The performance of the junction between the various antenna parts in such cases is a source of power loss.

Many limitations are placed on various solutions presently used to achieve waveguide-to-stripline coupling. For example, with regard to FIG. 1, we note that the structure of a conventional waveguide-to-stripline coupler consists of a stripline 2 which includes two plates 5, 6 and a central conductor 4 located flat on one of the sides 5 of a waveguide 1. Coupling is ensured by one or more radiating slots 3 coupled to the conducting core of the microstrip 4.

Even though efficient, this form of coupling does not result in coupling coefficients in excess of 0.1, i.e., 20 dB.

In relation to FIG. 2, a conventional coaxial waveguide coupler is shown consisting of a metal bar 7 of a length nearly that of a half-wave and located within a waveguide 8. This type of coupler results in substantial coupling coefficients, but is relatively selective, with the operational frequency band being narrow. Also, this type of coupler demands a connection system 9 appropriate to the particular ultimate stripline to be used.

The present invention wholly averts the drawbacks cited above.

The present invention makes possible coupling coefficients varying over a wide range from 6 dB to more than 30 dB.

The present invention permits a wide operational frequency band, 7.5% on either side of the nominal operating frequency, without thereby modifying the characteristics.

The present invention requires no intermediary component, the coupler being used being an integral part of the stripline, and the technical connection problems being eliminated.

Additional objects and advantages of the invention will be set forth in part in the description which follows, and in part will be obvious from the description, or may be learned by practice of the invention. The objects and advantages of the invention may be realized and obtained by means of the instrumentalities and combinations particularly pointed out in the appended claims.

To that end and in conformity with the invention, a directional microwave coupler to couple microwave energy from a waveguide transmission line to a stripline transmission line is provided which comprises a longitudinal slot fashioned in a side of said waveguide; a central conductor of said stripline extending through said slot and into said waveguide; and phase-shifting means for equalizing the phase velocity of the microwaves in said conductor and the phase velocity of the microwaves in said waveguide adjacent to said conductor. Advantageously, these phase-shifting means are one or more capacitors in series with the central conductor or else one or more inductors in parallel to each other and connected between the central conductor and a wall of waveguide.

Preferably, the coupler includes a stripline wherein the central conductor is within the waveguide for a length of about one fourth of the length of the guided wave.

The invention also relates to a method for coupling a waveguide transmission line and a stripline transmission line, where this method is characterized by placing a central stripline conductor within the waveguide through a slot in a wall of the waveguide and wherein the speed of propagation of the wave in the stripline is altered, and preferably accelerated by such phase-shifting means as one or more capacitors in series with the central conductor or one or more inductors in parallel to one another and connected between the central conductor and a wall of the waveguide, so as to substantially equalize the phase velocities in the two transmission lines in the area where the central stripline conductor is within the waveguide.

The invention and its implementation are shown in greater elucidation in relation to the description below and the attached drawings, wherein:

FIGS. 1 and 2 schematically show two types of conventional couplers;

FIG. 3 schematically shows a perspective of a coupler of the invention;

Figure 1:
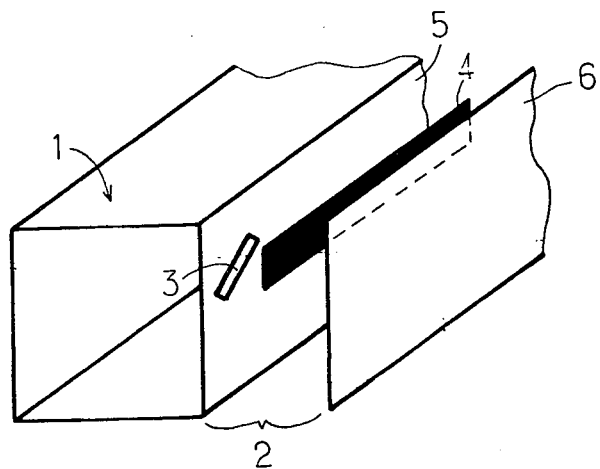
Figure 2:
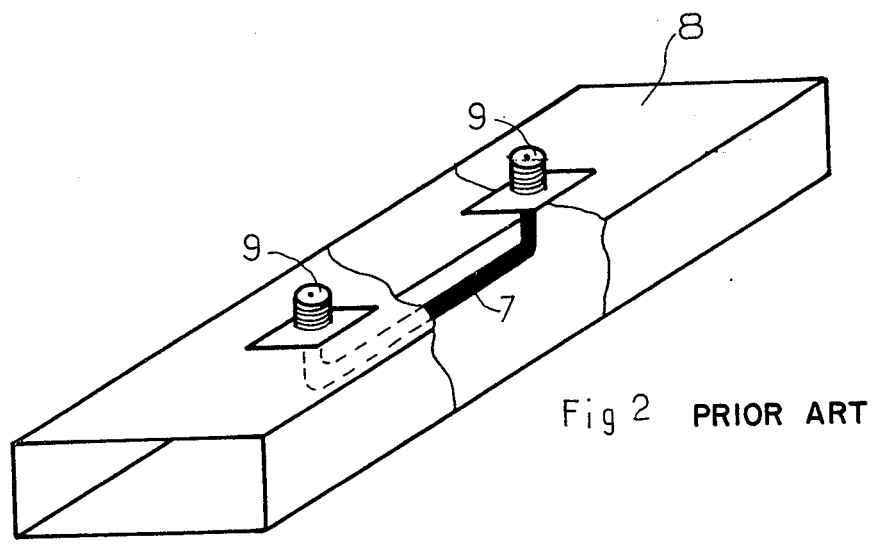

The above general description and the following detailed description are merely illustrative of the generic invention and additional modes, advantages, and particulars of this invention can be readily suggested to those skilled in the art without departing from the spirit and scope of the invention.

DESCRIPTION OF THE PREFERRED EMBODIMENTS

A coupler of the invention which operates in the 2,700 to 3,300 MHz band is described in an illustrative and non-limiting manner below in relation to FIG. 3. Obviously, this coupler can easily be made to operate in another frequency band.

A stripline is a multilayer means consisting of three dielectric layers 10, 11, 12 with a dielectric constant $\epsilon = 2.22$. Ports 3, 4 (circled numerals) referenced as 13, 14 of the stripline are implemented in the form of miniature coaxial connectors 15, 16 of the SMA type. The two outer dielectric layers 10, 12 are 1.6 mm thick and are externally metallized by a copper foil 35 microns thick in order to obtain two metal planes 17, 18.

The inside dielectric layer 11 is 0.4 mm thick and supports the central metal conductor 19 of the stripline consisting of an etched copper tape 2.7 mm wide providing a characteristic impedance of 50 ohms to the line.

This inside layer extends into the waveguide 20 of the WR284 type with 34 mm×72 mm dimensions through a slot 21 which is 38 mm long and 4 mm wide.

Inside the waveguide, the width of the central conductor 19 is increased to 8 mm in order to maintain a characteristic impedance of 50 ohms.

In order to achieve the same phase velocities, a phase-shifting cell is used, which consists of two capacitors 22, 23 of 1 picofarad each between which is inserted a metal conducting path 24 1 mm wide and 20 mm long, 35 microns thick and with a characteristic impedance of 130 ohms. The total coupler length is 42 mm for a guided wavelength of 140 mm.

The electric characteristics within the 2,700 to 3,300 MHz band are as follows:
coupling coefficient: 10 dB+/−0.3 dB;
directionality: exceeds 15 dB;
directionality in 2800-3200 MHz band: exceeds 20 dB;
standing wave ratio in the lower stripline path: less than 1.4;
standing wave ratio in the lower waveguide path: less than 1.1; and
peak power tolerance: exceeds 100 kw in the waveguide path.

Figure 3:
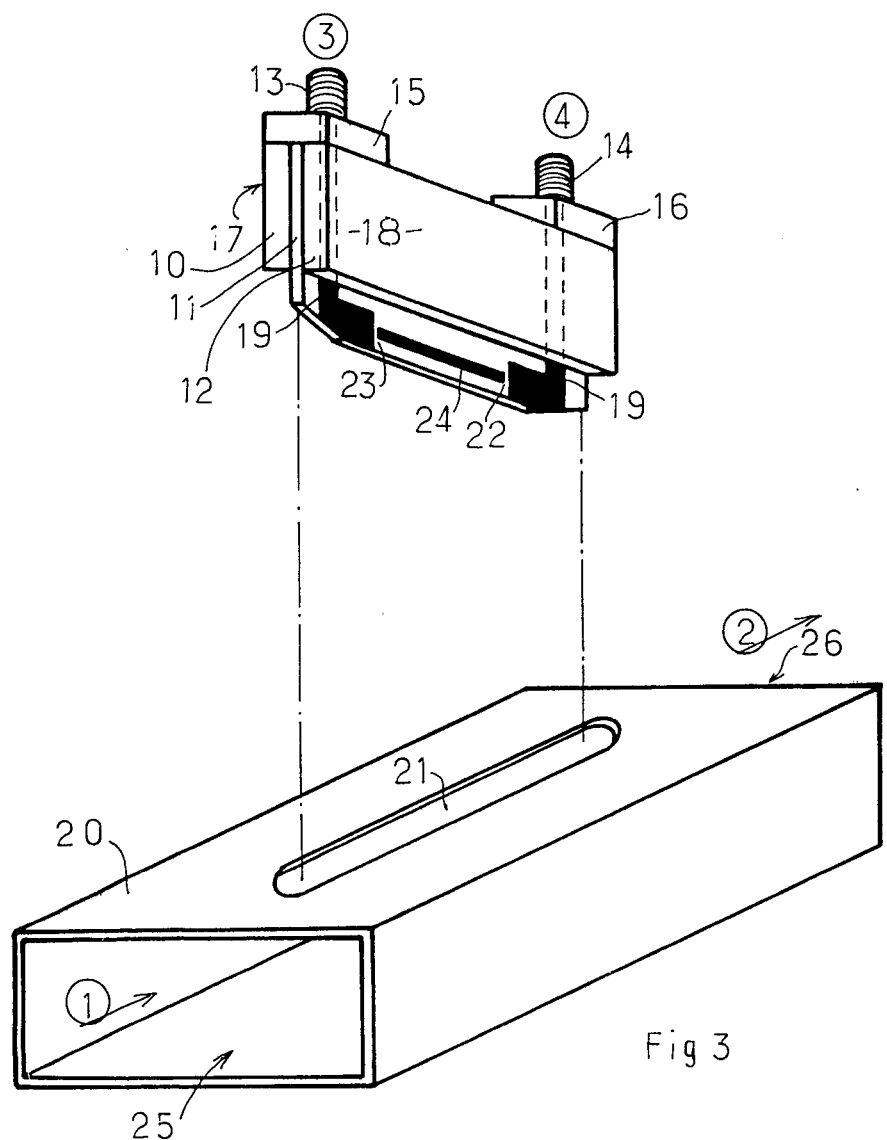

By periodically loading the central conductor by means of series capacitors or parallel inductors (FIG. 3 illustrates a case using two capacitors 22, 23), the phase velocity of the stripline is accelerated and made equal to the waveguide phase velocity. In this manner good directional coupling between the waveguide (TE mode) and the stripline (TEM mode) is obtained. The electrical length of the coupler as seen by the input 3 (circled number) of the stripline equals one quarter of the guided wavelength. Thus the problem is reduced to coupling between two identical lines.

Figure 4:
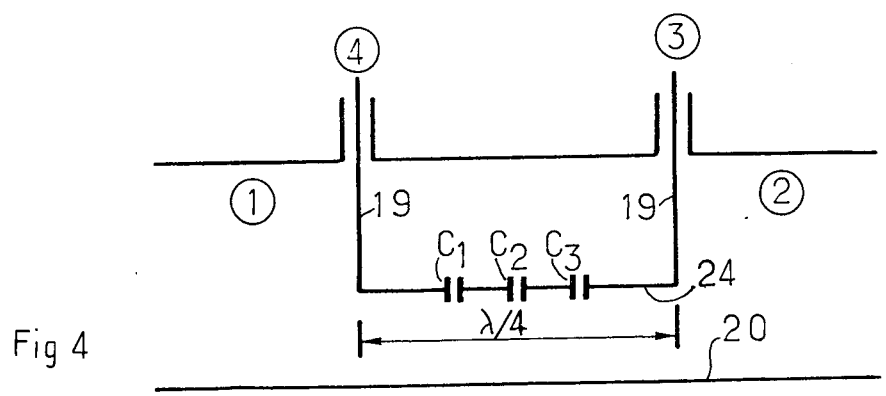
FIGS. 4 and 5 are electric diagrams relating to modifications of the coupler illustrated in FIG. 3.
Figure 5:
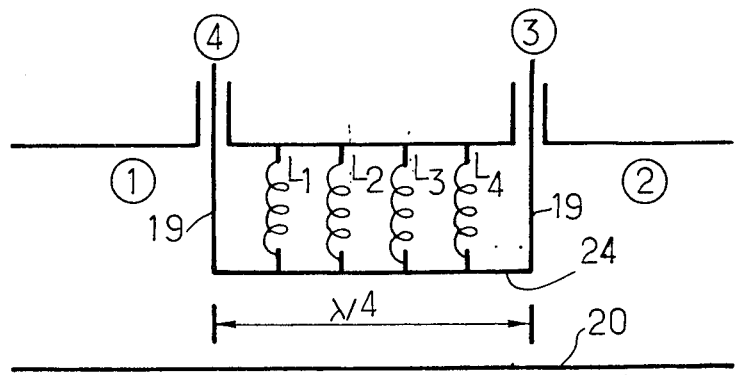

FIGS. 4 and 5 schematically show two couplers designed on the same principle as that of FIG. 3 with three capacitors C1, C2, C3 in series with the conductor 24 or with four inductors L1, L2, L3, L4 in parallel between the conductor 24 and the adjacent wall of the waveguide 20. Obviously, the number of capacitors or inductors used is not meant to be limiting. The ports 1 and 2 (circled numbers) are the inputs and outputs of the waveguide (TE mode) and the ports 3 and 4 (circled numbers) are the outputs of the stripline (TEM mode).

Varying coupling values are obtained when modifying the width and the depth of the conducting path 24. Optimal adjustment and directionality are implemented by means of the capacitors or inductors.

When the line is loaded by only two capacitors 22, 23 as illustrated in FIG. 3, a directionality exceeding 20 dB is obtained in a 13% frequency band, namely from 2800 MHz to 3200 MHz. The coupling coefficients may vary from 6 dB to 30 dB depending on the width of the track 24. This solution therefore offers the advantage of achieving compact couplers with a wide frequency band and eliminates any connection problems.

Also, by controlling the capacitances, it is possible to further shorten the coupler length, however at the expense of the frequency band.

Figure 6:
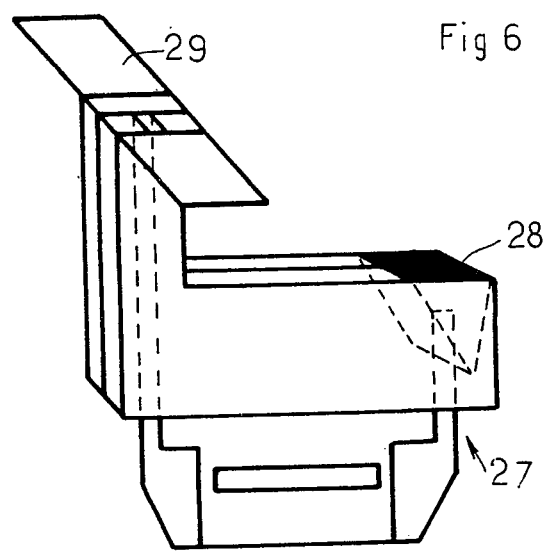
FIG. 6 is a schematic perspective of an alternative embodiment of the coupler of the invention.

FIG. 6 shows an important application of an embodiment of the coupler of the invention in designing radiation modules by combining a coupler 27 of the type described (FIG. 3), a matched load 28 and a radiating dipole 29. The coupler is an integral part of the transmitting stripline. The radiating element, also designed as a stripline, is without auxiliary connecting means. This coupler also can be used to control power in waveguide apparatus by fashioning a slight longitudinal slot at the center of the large side of the waveguide (where this slot does not radiate and causes no perturbation).

To that end, it suffices to plunge the central conductor of the coupler of the invention into the waveguide which is to be controlled through a longitudinal slot, which neither radiates nor perturbs because the slot is made in the center of the large side of the waveguide, and to connect the central conductor to a milliwatt-meter.

Figure 7:
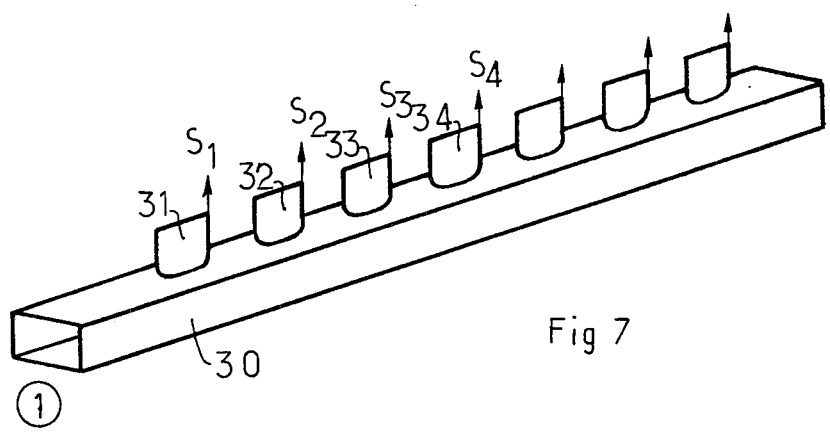
FIG. 7 is a schematic perspective of still another embodiment of the coupler of the invention.

FIG. 7 illustrates another application, namely an array of plane antenna power distribution plates, where the radiating elements are made of striplines. The distribution array consists of a waveguide 30 on which are associated in series several couplers 31, 32, 33 . . . . The input 1 (circled number) of the distributor can tolerate high powers, and the outputs S1, S2 . . . are independent and mutually decoupled.

As it is possible to specify the coupling coefficient of each coupler within the range of 6 to 30 dB, it is also possible to achieve any arbitrarily desired radiated energy distribution.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or scope of applicants' general inventive concept.

We claim:

1. A directional microwave coupler to couple microwave energy from a waveguide transmission line to a stripline transmission line comprising:
   (a) a longitudinal slot fashioned in a side of said waveguide;
   (b) a central conductor of said stripline extending through said slot and into said waveguide; and
   (c) phase-shifting means including at least one capacitor mounted in series with said central conductor for equalizing the phase velocity of the microwaves in said conductor and the phase velocity of the microwaves in said waveguide adjacent to said conductor.

2. A directional microwave coupler to couple microwave energy from a waveguide transmission line to a stripline transmission line comprising:
   (a) a longitudinal slot fashioned in a side of said waveguide;
   (b) a central conductor of said stripline extending through said slot and into said waveguide; and
   (c) phase-shifting means including at least one inductor connected between said central conductor and a wall of said waveguide for equalizing the phase velocity of the microwaves in said conductor and the phase velocity of the microwaves in said waveguide adjacent to said conductor.

3. A coupler of claim 1 or 2, characterized in that the cross-section of said central conductor widens at the points of entry into said waveguide.

4. A coupler of claim 1 or 2, characterized in that said stripline comprises a central dielectric layer supporting said central conductor; two port conductors located outside said waveguide, said central conductor having end sections which extend from the interior of said waveguide, through said slot, and connect to said ports, respectively, each of said end sections having a widened portion inside said waveguide; and two dielectric layers surrounding that part of said end sections of said central conductor located outside of said waveguide by means of their external sides and stopping flush with the outside of the waveguide.

5. A coupler of claim 4, characterized in that the distance between the two port conductors located outside of said waveguide is substantially equal to a quarter wavelength of said microwaves in said waveguide.

6. A power-distributing device comprising more than one directional microwave coupler for coupling microwave energy from a waveguide transmission line to stripline transmission lines, each of said couplers comprising:
   (a) a longitudinal slot fashioned in a side of said waveguide;
   (b) a central conductor of a respective stripline extending through said slot and into said waveguide; and
   (c) phase-shifting means for equalizing the phase velocity of the microwaves in said conductor and the phase velocity of the microwaves in said waveguide adjacent to said conductor; and wherein said couplers are mounted in series on said waveguide and at least one of said couplers is characterized in that said phase shifting means includes at least one capacitor mounted in series with said central conductor.

7. A power-distributing device comprising more than one directional microwave coupler for coupling microwave energy from a waveguide transmission line to stripline transmission lines, each of said couplers comprising:
   (a) a longitudinal slot fashioned in a side of said waveguide;
   (b) a central conductor of a respective stripline extending through said slot and into said waveguide; and
   (c) phase-shifting means for equalizing the phase velocity of the microwaves in said conductor and the phase velocity of the microwaves in said waveguide adjacent to said conductor; and
   wherein said couplers are mounted in series on said waveguide and at least one of said couplers is characterized in that said phase shifting means includes at least one inductor connected between said central conductor and a wall of said waveguide.

8. A power-distributing device according to claim 6 or 7, wherein at least one coupler is characterized in that the cross-section of said central conductor widens at the points of entry into said waveguide.

9. A power-distributing device according to claim 6 or 7, wherein at least one of said couplers is characterized in that said respective stripline comprises a central dielectric layer supporting said central conductor; two port conductors located outside of said waveguide, said central conductor having end sections which extend from the interior of said waveguide, through said slot, and connect to said ports, respectively, each of said end sections having a widened portion inside said waveguide; and two dielectric layers surrounding that part of said end sections of said central conductor located outside said waveguide by means of their external sides and stopping flush with the ouside of the waveguide.

10. A power-distributing device according to claim 9, wherein at least one of said couplers is characterized in that the distance between the two ports conductors located outside said waveguide is substantially equal to a quarter wavelenth of said microwaves in said waveguide.

11. An apparatus forming a radiation module comprising a coupler mounted on a waveguide, said coupler being connected by one of its outputs to a matched load and by its other output to a radiating dipole, said coupler comprising:
   (a) a longitudinal slot fashioned in a side of said waveguide;
   (b) a central conductor of said stripline extending through said slot and into said waveguide; and
   (c) phase-shifting means for equalizing the phase velocity of the microwaves in said conductor and the phase velocity of the microwaves in said waveguide adjacent to said conductor; and wherein said coupler is characterized in that said phase shifting means includes at least one capacitor mounted in series with said central conductor.

12. An apparatus forming a radiation module comprising a coupler mounted on a waveguide, said coupler being connected by one of its outputs to a matched load and by its other output to a radiating dipole, said coupler comprising:
   (a) a longitudinal slot fashioned in a side of said waveguide;
   (b) a central conductor of said stripline extending through said slot and into said waveguide; and
   (c) phase shifting means for equalizing the phase velocity of the microwaves in said conductor and the phase velocity of the microwaves in said waveguide adjacent to said conductor; and
   wherein said coupler is characterized in that said phase shifting means includes at least one inductor connected between said central conductor and a wall of said waveguide.

13. An apparatus forming a radiation module according to claim 11 or 12, wherein said coupler is characterized in that the cross-section of said central conductor widens at the points of entry into said waveguide.

14. An apparatus forming a radiation module according to claim 11 or 12, wherein said coupler is characterized in that said stripline comprises a central dielectric layer supporting said central conductor; two port conductors located outside said waveguide, said central conductor having end sections which extend from the exterior of said waveguide through said slot, and connected to said ports, respectively, each of said end sections having a widened portion inside said waveguide; and two external dielectric layers surrounding that poart of said end sections of said central conductor located outside said waveguide by means of their external sides and stopping flush with the outside of the waveguide.

15. An apparatus forming a radiation module according to claim 14, wherein said coupler is characterized in that the distance between the port conductors located outside said waveguide is substantially equal to a quarter wavelength of said microwaves in said waveguide.

* * * * *

UNITED STATES PATENT AND TRADEMARK OFFICE
CERTIFICATE OF CORRECTION

PATENT NO. : 4,433,313

DATED : February 21, 1984

INVENTOR(S) : Saint et al.

It is certified that error appears in the above—identified patent and that said Letters Patent is hereby corrected as shown below:

Column 5, line 63, change "ouside" to --outside--.

Column 6, line 50, change "exterior" to --interior--.

line 54, change "poart" to --part--.

Signed and Sealed this

Nineteenth Day of June 1984

[SEAL]

Attest:

Attesting Officer

GERALD J. MOSSINGHOFF

Commissioner of Patents and Trademarks